United States Patent [19]
Niemann et al.

[11] Patent Number: 5,865,413
[45] Date of Patent: Feb. 2, 1999

[54] SURFACE MOUNTABLE COMPONENT HOLDER

[75] Inventors: Paul C. Niemann, Downers Grove; Yan Alexander Gonsky, Buffalo Grove; Jeff Kotz, Schaumburg, all of Ill.

[73] Assignee: Motorola Inc., Schaumburg, Ill.

[21] Appl. No.: 512,255

[22] Filed: Aug. 7, 1995

[51] Int. Cl.⁶ .................................................. A47F 5/00
[52] U.S. Cl. ................................................................ 248/314
[58] Field of Search ........................ 248/74.2, 56, 316.7, 248/674, 300, 27.3; 206/722, 701; 361/821, 517, 513, 519, 535, 537

[56] References Cited

U.S. PATENT DOCUMENTS

| | | |
|---|---|---|
| 3,248,078 | 4/1966 | Ast ............................................ 248/27.3 |
| 3,270,251 | 8/1966 | Evans ........................................ 361/729 |
| 4,220,384 | 9/1980 | Clark et al. ........................... 206/722 X |
| 4,606,590 | 8/1986 | Kauffmann et al. . |
| 4,629,278 | 12/1986 | Norton et al. . |
| 5,055,971 | 10/1991 | Fudala et al. . |
| 5,130,888 | 7/1992 | Moore . |
| 5,420,748 | 5/1995 | Ryu ...................................... 361/535 X |

*Primary Examiner*—Leslie A. Braun
*Assistant Examiner*—Gwendolyn Baxter
*Attorney, Agent, or Firm*—Nicholas C. Hopman

[57] ABSTRACT

A surface mountable auto-onsertable component holder (100) includes captivating structures (123, 125, 127 and 129) on opposing walls (101, 103, 115, and 117) to hold an electrical component (200) in place.

11 Claims, 2 Drawing Sheets

SURFACE MOUNTABLE COMPONENT HOLDER

FIELD OF THE INVENTION

This invention is generally directed to the field of electrical circuit component mounting, and can be useful for captivating a non-surface mountable component and providing the necessary features to assemble it to a substrate using surface mount assembly techniques.

BACKGROUND OF THE INVENTION

Contemporary electronic modules are typically constructed using individual electrical components that are typically adhered to a substrate by means of solder. As the demand increases for smaller and smaller electronic modules, a trend is to construct those using surface mountable components. One problem with use of surface mountable components in these electronic modules, is that they are subjected to vibration, mechanical shock, and environments with large thermal excursions. This is particularly true in the automotive underhood environment. Small (mass) components usually fair better than larger (mass) components, but in some cases the system designer has no choice but to use a large component which is susceptible to failure under high levels of vibration, mechanical shock and/or thermal stresses. For instance, many systems designers are forced, because of other considerations, to use relatively large electrolytic capacitors in their designs. Large capacity electrolytic capacitors are not available in compact surface mount packages. Because of this, electrolytic capacitors necessary for circuit function on these substrates are of a leaded variety. Ordinarily, leaded capacitors are inserted onto substrates with the leads projecting through holes in the substrate. This projection through the substrate of the leads helps physically secure the capacitor in severe vibration and shock situations.

Because in an all-surface mount substrate design through holes for component mounting are not present the capacitor lead through the hole connection cannot be relied on to help physically secure the capacitor component.

In prior art schemes leaded electrolytic capacitors have their leads formed and soldered in a face-to-face mating arrangement with a surface mount substrate. To increase the physical strength of the coupling between the capacitor and the surface mount substrate, another physical component is used to captivate the capacitor and hold it firmly to the substrate. One problem with prior art approaches to this extra mechanical component is that they are difficult to place automatically using component onsert machines. In fact, many prior art schemes used component holders that relied on through-substrate holes to maintain a robust coupling to the substrate.

Other prior art schemes used captivating clips that are vertically oriented. Using this type of approach would violate capacitor component heights restrictions and, furthermore, cause the capacitive component to be susceptible to vibration.

What is needed is an improved device for captivating large circuit components onto a substrate in a surface mountable and auto-onsertable configuration.

DETAILED DESCRIPTION OF THE PREFERRED EMBODIMENT

A surface mountable auto-onsertable component holder includes captivating structures on opposing walls to hold an electrical component in place. A more thorough understanding of the inventive aspects of the above-introduced structure will become apparent with the introduction and detailed description of the figures.

Figure 1:
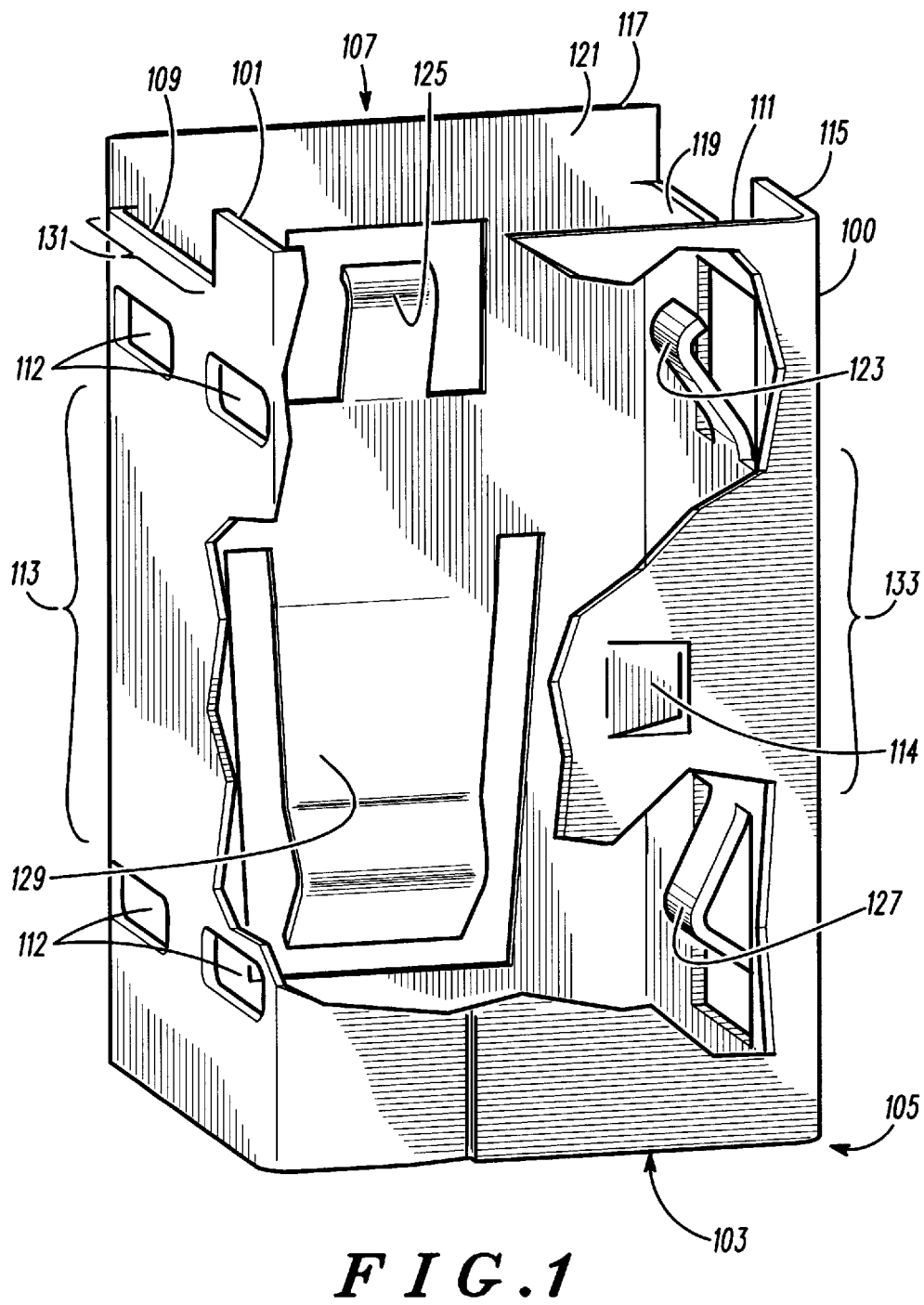
FIG. 1 is an isometric view of a surface mountable component holder in accordance with a preferred embodiment of the invention.

FIG. 1 is an isometric view of a surface mountable, onsertable, component holder 100 in accordance with a preferred embodiment of the invention. The component holder 100 is preferably formed as a hollow structure and preferably constructed of a spring steel material. Using a spring steel material enhances the function of later described captivating features. First 101 and second 103 walls extend from an entry end 105 to an exit end 107. Each of the first 101 and second 103 walls include and inside surface 109 and 111 respectively. The first 101 wall has a soldering vent 112 disposed therethrough which allows the holder 100 to properly seat on a substrate after a soldering operation. Preferably, the first wall 101 further incorporates a flat continuous structure 113 of about 6 mm by 6 mm between the solder vents 112 to properly solder the component holder 100 to a substrate.

A captivating structure 114 is formed proximate a center position of the second wall 103 which allows the component holder 100 to properly support a component after an insertion operation. This is necessary because the component holder 100 is formed from a flat piece of stock using a forming machine which inherently result in a seam where the flat piece of stock is joined. The captivating structure 114 holds to component holder closed at the resulting seam.

Third 115 and fourth 117 walls extend from the entry end 105 to the exit end 107. Each of the third 115 and fourth 117 walls include another inside surface, 119 and 121 respectively, which face the inside surfaces 109 and 111 of the first 101 and second 103 walls. The fourth 117 wall is oriented substantially at a right angle to the third 115 wall. The second wall 103 has the same relationship with the first wall 101. Essentially the component holder 100 is formed as a rectangular box. Of course other geometric forms will also function as well as long as the essential structure is maintained.

A first captivating structure 123 is formed proximate the exit end 107 of the third 115 wall and protrudes towards the inside surface 109 of the first wall 101. A second captivating structure 125 is formed proximate the exit end 107 of the fourth 117 wall and protrudes towards the inside surface 111 of the second wall 103. A third captivating structure 127 is formed proximate the entry end 105 of the third 115 wall and protrudes towards the inside surface 109 of the first wall 101. A fourth captivating structure 129 is formed proximate the entry end 105 of the fourth 117 wall and protrudes towards the inside surface 111 of the second wall 103. Preferably, the fourth captivating structure 129 has a geometry larger than a geometry of the second captivating structure 125. The geometry of the fourth captivating structure 129 is designed to allow insertion of a component while firmly captivating it after insertion. A force it resists the component insertion and subsequent removal is dependent largely on its geometry. The second captivating structure 125 is kept relatively small because resistance to insertion and removal of the component is principally the work of the fourth captivating structure 129. Here, the second captivating structure 125 has a geometry larger than a geometry of the first and third captivating structures 121 and 127, largely because there is more room for the second captivating structure 125. The first and third captivating structures 121 and 127 are kept relatively small simply to minimize the overall size of the component holder 100.

A biasing feature 131 is provided proximate the exit end 107 of the first and third walls 101 and 115 by removing a small rectangular section of material from the first and third walls 101 and 115 where they intersect the fourth wall 117. This biasing feature can be used to orient the component holder to a component and/or a substrate. The third wall 115 further incorporates a flat continuous structure 133 of about 6 mm by 6 mm between the first and third captivating structures 123 and 127 and approximately parallel to mounting surface 113 to properly pick up and place the component holder 100 on a substrate.

Figure 2:
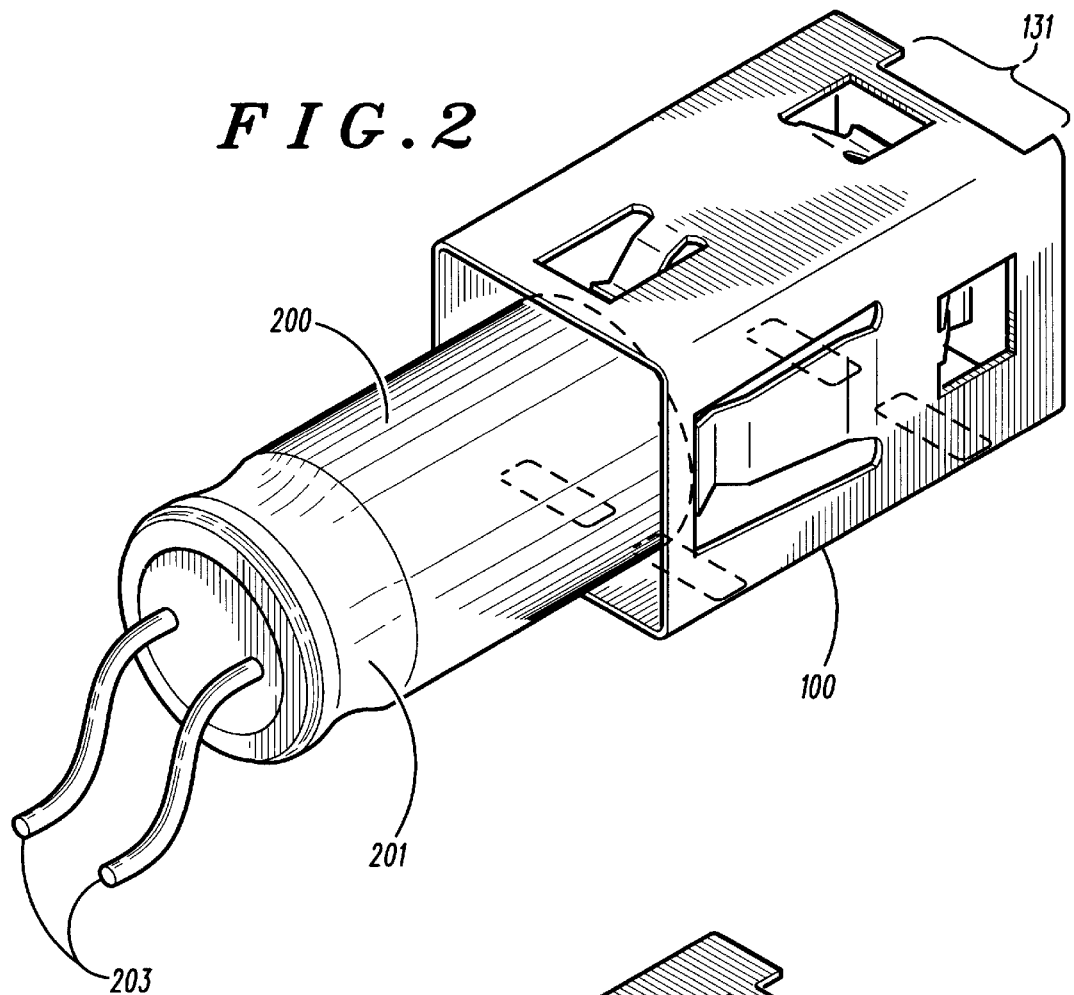
FIG. 2 is an isometric view of a surface mountable component holder with a component to be inserted.

FIG. 2 is an isometric view of the surface mountable component holder 100 with a cylindrical component 200 to be inserted. Component 200 is inserted into the holder, causing the third and fourth captivating structures 127 and 129 first to deflect and then to guide the component into proper position and later, as the insertion operation is completed, to engage an indented feature 201 of the component 200 providing a constant force that presses the exterior surface of the component 200 against interior surfaces 109 and 111 of the component holder 100, while simultaneously preventing the component 200 from disengaging from the component holder 100. Insertion of the component 200 is assisted by providing a continuous strip of material in the first wall 101 from the entry end 105 to the exit end 107 along the line of contact between the cylindrical component 200 and the inside surface 109 of the first wall 101. The first and second captivating structures 123 and 125 are also deflected by the component 200 during the insertion operation, contacting the exterior surface of the component 200 and providing a constant force that presses the exterior surface of the component 200 against interior surfaces 109 and 111 of the component holder 100, while simultaneously orienting the component 200 parallel to an axis extending from the entry end 105 to the exit end 107 of the component holder 100.

Captivating structures, 123, 125, 127, and 129 provide sufficient constant force to the component 200 to hold the component 200 firmly in place in the component holder 100 and resist damaging vibration forces in the component's operational environment. Captivating structure 114 maintains the orientation of all four walls 101, 103, 115, and 107 allowing captivating structures, 123, 125, 127, and 129 to apply retaining forces to the component 200 without altering the parallel orientation between the first and third walls 101 and 115 necessary for onsertion of the component and holder assembly on a substrate. Captivating structures, 123, 125, 127, and 129, in addition to providing a retaining and orienting function, also maintain coplanarity between lead wires 203 of the component 200 and the first wall 101 of the component holder 100. A biasing feature 131 is used to orient the component holder 100 with respect to the component 200 prior to and during the automation operation and enables automation of the insertion operation. The component 200 shown here is an electrolytic capacitor but may be another type of component as well.

Figure 3:
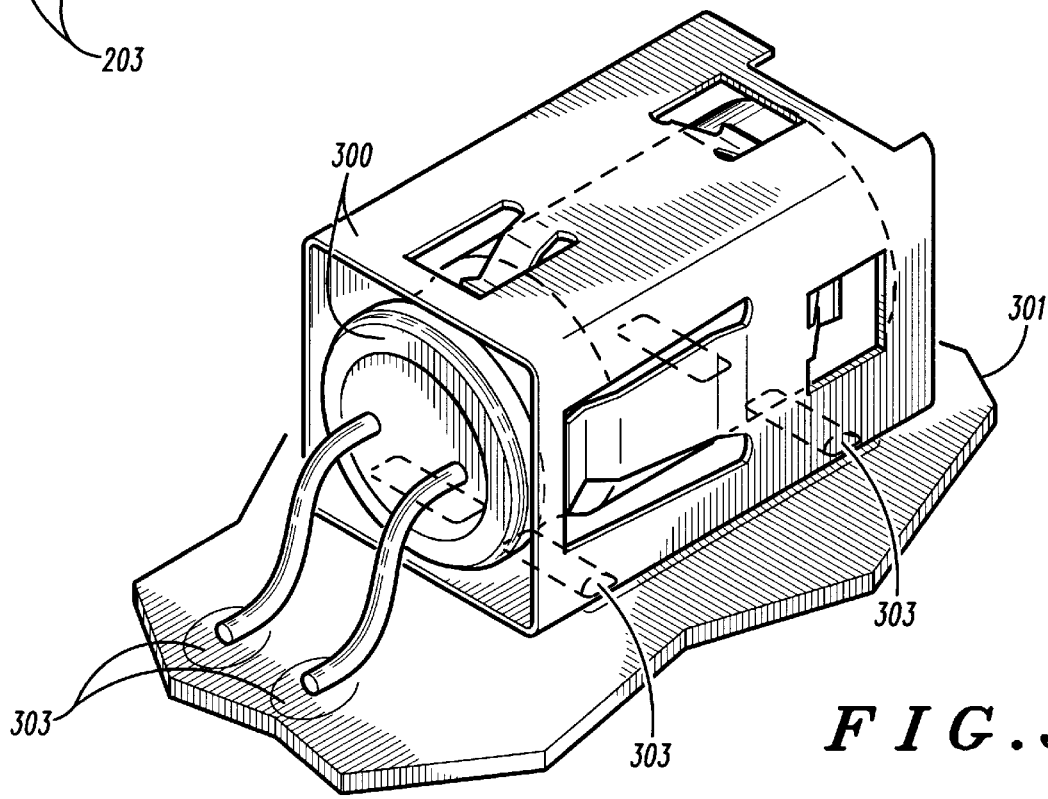
FIG. 3 is an isometric view of a surface mountable component holder with the component shown in FIG. 2 inserted.

FIG. 3 is an isometric view of the surface mountable component holder with the component as shown in FIG. 2 inserted 300 and being onserted to a substrate 301. The component and holder assembly 300 is either manually placed on the substrate 301 or automatically onserted to the substrate 301, and soldered into place at the component leads 203 and under the first wall 101 of the component holder 100. The first wall 101 provides a flat mounting surface for the component and holder assembly 300 which improves the ability to correctly place the component and holder assembly 300, and in combination with the flat continuous structures 113 and 133, enables automatic onsertion of the component and holder assembly 300 to the substrate 301. Furthermore, the structure provides a solderable surface to mechanically join the component and holder assembly 300 to the substrate 301, and limits a relative displacement between the component 200 and the substrate 301, while the substrate 301 is in its intended operating environment. Solder vents 112 break surface tension of molten solder 303 to prevent the component and holder assembly 300 from floating on the solder 303 and shifting out of position during a solder reflow operation.

In conclusion, an improved device useful for captivating relatively-large a non-surface mountable components and providing the necessary features to assemble it to a substrate using surface mount assembly techniques.

What is claimed is:

1. A component holder comprising:
    a surface mountable hollow structure having first and second walls extending from an entry end to an exit end, the first and second walls facing elongated third and fourth walls respectively, wherein the elongated third and fourth walls comprise a surface with a captivating feature disposed on a portion of each wall positioned proximate the exit end, and wherein the captivating features are oriented protruding towards the first and second walls, and wherein the first wall has a substantially flat outer surface and a soldering vent disposed therethrough.

2. A component holder in accordance with claim 1 wherein the surface mountable hollow structure is constructed of a spring steel material.

3. A component holder in accordance with claim 1 further comprising:
    additional captivating features disposed on another portion of each of the elongated third and fourth walls, wherein the additional captivating features are positioned proximate the entry end.

4. A component holder in accordance with claim 1 further comprising a biasing feature oriented on the exit end of the first and third walls.

5. A surface mountable, auto-onsertable component holder for captivating an electrical component, the component holder comprising:
    first and second walls extended from an entry end to an exit end, wherein each of the first and second walls include an inside surface, and wherein the first wall has a substantially flat outer surface and a soldering vent disposed therethrough; and
    third and fourth walls extended from the entry end to the exit end, wherein each of the third and fourth walls include another inside surface facing the inside surface of each of the first and second walls respectively, wherein the fourth wall is oriented substantially at a right angle to the third wall, and wherein a first captivating structure is formed proximate the exit end of the third wall protruding towards the inside surface of the first wall, and a second captivating structure is formed proximate the exit end of the fourth wall protruding towards the inside surface of the second wall.

6. A component holder in accordance with claim 5 further comprising:

a third captivating structure formed proximate the entry end of the third wall protruding towards the inside surface of the first wall, and a fourth captivating structure formed proximate the entry end of the fourth wall protruding towards the inside surface of the second wall.

7. A component holder in accordance with claim 6 wherein a geometry of the fourth captivating structure is larger than a geometry of the first captivating structure.

8. A component holder in accordance with claim 5 wherein the surface mountable component holder is constructed of a spring steel material.

9. A component holder in accordance with claim 8 wherein the soldering vent comprises a flat continuous structure of at least 6 mm by 6 mm.

10. A component holder in accordance with claim 8 further comprising a biasing feature oriented on the exit end of the first and third walls.

11. A surface mountable, auto-onsertable component holder for captivating an electrical component, the component holder comprising:

a surface mountable hollow structure constructed of a spring steel material having first and second walls extended from an entry end to an exit end, wherein each of the first and second walls include an inside surface, wherein the first wall has a soldering vent disposed therethrough, and wherein the first wall has a substantially flat outer surface;

third and fourth walls extended from the entry end to the exit end, wherein each of the third and fourth walls include another inside surface facing the inside surface of each of the first and second walls respectively, wherein the fourth wall is oriented substantially at a right angle to the third wall, and wherein a first captivating structure is formed proximate the exit end of the third wall protruding towards the inside surface of the first wall, and a second captivating structure is formed proximate the exit end of the fourth wall protruding towards the inside surface of the second wall; and a third captivating structure formed proximate the entry end of the third wall protruding towards the inside surface of the first wall, and a fourth captivating structure is formed proximate the entry end of the fourth wall protruding towards the inside surface of the second wall, wherein the fourth captivating structure is larger than a geometry of the first captivating structure.

* * * * *